United States Patent
Okazaki et al.

[11] Patent Number: 5,422,221
[45] Date of Patent: Jun. 6, 1995

[54] RESIST COMPOSITIONS

[75] Inventors: Satoshi Okazaki, Takasaki; Mitsuo Umemura, Usui; Hiroshi Kanbara, Takasaki; Jun Hatakeyama, Annaka; Tetsuya Inukai, Annaka; Kazuhiro Nishikawa, Annaka, all of Japan

[73] Assignee: Shin-Etsu Chemical Co., Ltd., Tokyo, Japan

[21] Appl. No.: 197,524

[22] Filed: Feb. 16, 1994

[30] Foreign Application Priority Data

Feb. 17, 1993 [JP] Japan .................. 5-051465

[51] Int. Cl.⁶ .............................. G03F 7/023
[52] U.S. Cl. ............................ 430/190; 430/165; 430/169; 430/191; 430/192; 430/193; 525/504; 528/162
[58] Field of Search ........... 430/190, 192, 193, 191, 430/169, 165; 528/162; 525/504

[56] References Cited

U.S. PATENT DOCUMENTS 4,477,553 10/1984 Yamamoto et al. ............... 430/190
5,279,918 1/1994 Nishi et al. ...................... 430/190

FOREIGN PATENT DOCUMENTS 0358871 3/1990 European Pat. Off.
2-275955 11/1990 Japan.
1227602 4/1971 United Kingdom ............ 430/190

OTHER PUBLICATIONS

Nikkei Microdevices, vol. 4 (1992), pp. 44–46.

Primary Examiner—Charles L. Bowers, Jr.
Assistant Examiner—John S. Chu
Attorney, Agent, or Firm—Millen, White, Zelano & Branigan

[57] ABSTRACT

In a resist composition, a novolak resin including at least one recurring unit of the formula (1):

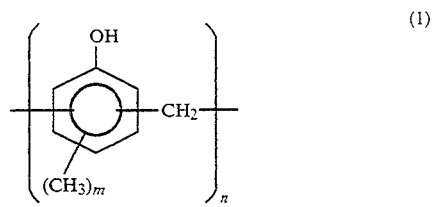

wherein n is an integer of 1 to 4 and m is an integer of 0 to 3, having a weight average molecular weight of 1,000 to 10,000 calculated as polystyrene, and having the hydrogen atom of a hydroxyl group therein replaced by a 1,2-naphthoquinonediazidosulfonyl group in a proportion of 0.03 to 0.27 mol per hydrogen atom serves as an alkali-soluble resin and a photosensitive agent. The composition is uniform in that the photosensitive agent is uniformly incorporated in the novolak resin, and thus forms a uniform resist film. It is a useful positive resist having improved sensitivity, resolution, heat resistance, and film retentivity.

9 Claims, No Drawings

RESIST COMPOSITIONS

BACKGROUND OF THE INVENTION

1. Field of the Invention

This invention relates to a resist composition predominantly comprising a novolak resin serving as both an alkali-soluble resin and a photosensitive agent, the composition being useful as a positive resist having many advantages of uniformity, sensitivity, resolution, heat resistance and film retentivity.

2. Prior Art

Prior art novolak system resist compositions use a novolak resin and a photosensitive agent as two main components. In order that resists have high resolution, heat resistance and film retentivity and match with the wavelength of a light source in various exposure equipment, a number of improvements have been made from both the sides of novolak resin and photosensitive agent. One approach from the novolak resin side was to reduce the average molecular weight of novolak resin on synthesis whereby the resulting resist was improved in resolution and in sensitivity at the sacrifice of heat resistance and film retentivity (see Japanese Patent Application Kokai No. 2-275955 or EP 0358871A2). Then an attempt was made to remove low molecular weight novolak components from the synthesized novolak resin by suitable means such as reprecipitation. One exemplary approach from the photosensitive agent side, which is based on the fact that resists containing conventionally used benzophenone photosensitive agents are less transmissive to light as the light source of an exposure equipment varies from g-rays to i-rays, was the use of non-benzophenone photosensitive agents having minimal absorption of i-rays (see Nikkei Micro-Device, April 1992, page 45).

While resists with higher resolution might be obtained by combining these approaches, a number of steps must be added to the resist manufacturing process, resulting in the disadvantage of increased cost.

SUMMARY OF THE INVENTION

Making investigations for solving the above-mentioned problem of the prior art and providing a resist composition featuring high sensitivity, high resolution, heat resistance, and film retentivity, the inventors have found that a novolak resin including at least one recurring unit of the formula (1):

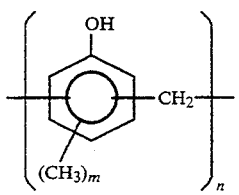

(1)

wherein n is an integer of 1 to 4 and m is an integer of 0 to 3, and having a weight average molecular weight (Mw) of 1,000 to 10,000 calculated as polystyrene wherein the hydrogen atom of a hydroxyl group in the novolak resin is replaced by a 1,2-naphthoquinonediazidosulfonyl group in a proportion of 0.03 to 0.27 mol per hydrogen atom can serve as an alkali-soluble resin and a photosensitive agent so that a one component system resist composition is available. The resist composition comprising as a major component such a novolak resin having a 1,2-naphthoquinonediazidosulfonyl group introduced therein can form a resist film which is improved in uniformity, sensitivity, resolution, heat resistance, and film retentivity.

Although the novolak resin used herein has a relatively low molecular weight as represented by Mw of 1,000 to 10,000, it can form a fully heat resistant resist film without a need for an extra step of removing low molecular weight components. The reason is presumed as below. When a novolak resin as synthesized is partially esterified with 1,2-naphthoquinonediazidosulfonic acid, only low molecular weight components of the novolak resin are preferentially esterified into components serving as a photosensitive agent and the rest of the novolak resin serves as a film forming component which is at least equally effective to those novolak resins from which low molecular weight components have been removed.

The resist composition of the present invention maintains a low average molecular weight prior to exposure because the novolak resin is integral with the photosensitive agent. As a result, while high resolution is maintained, the composition upon development undergoes crosslinking reaction to a higher molecular weight by virtue of azo coupling reaction during development. Thus the resulting resist pattern is fully heat resistant. In this way, high resolution and heat resistance are established as the same time according to the present invention.

The mother nucleus of the photosensitive agent is the novolak resin itself, which eliminates a need to change the photosensitive agent when the wavelength of various light sources changes. Therefore, a resist composition with high resolution and high heat resistance can be prepared by a simple process at a low cost. This resist composition is universally applicable independent of the wavelength of a light source of various exposure equipment. Additionally, because of a single component system, a resist composition of consistent quality can be prepared without performance differential which is otherwise introduced by a slight variation in blending ratio of novolak resin and photosensitive agent during preparation.

DETAILED DESCRIPTION OF THE INVENTION

The resist composition of the present invention is comprised of a novolak resin including at least one recurring unit of formula (1):

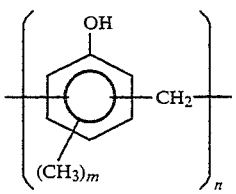

(1)

wherein n is an integer of 1 to 4 and m is an integer of 0 to 3. The novolak resin has a weight average molecular weight (Mw) of 1,000 to 10,000 calculated as polystyrene. The hydrogen atom of a hydroxyl group in the novolak resin is replaced by a 1,2-naphthoquinonediazidosulfonyl group in a proportion of 0.03 to 0.27 mol per hydrogen atom. This novolak resin serves as an alkali-soluble resin and a photosensitive agent.

The novolak resin of formula (1) can be prepared by polycondensation of a phenol and an aldehyde in a conventional manner.

Preferred examples of the phenol used herein include m-cresol, p-cresol and mixtures thereof. While the phenol is not limited to these examples, there may be used phenol, various xylenol isomers and trimethylphenol isomers and mixtures thereof.

Formaldehyde is a preferred example of the aldehyde to be polycondensed with the phenol. While the aldehyde is not limited to these examples, there may be used aldehydes having up to 4 carbon atoms such as acetoaldehyde, propylaldehyde, and butylaldehyde and mixtures thereof. The aldehyde is preferably used in amounts of 0.3 to 1.5 mol per mol of the phenyl in order to form a novolak resin with Mw of 1,000 to 10,000.

Catalysts are used for polycondensation. Preferred catalysts are oxalic acid, acetic acid and formic acid while hydrochloric acid, nitric acid and sulfuric acid are also useful. The reaction solvent is a hydrophilic solvent such as methanol and dioxane. The reaction temperature is preferably 50° to 150° C. After the completion of polycondensation, it is recommended to remove the unreacted reactants and catalyst. To this end, the reaction mixture is subject to vacuum stripping at 130° to 250° C. or washed with water, extracted with such a solvent as ethyl cellosolve acetate (ECA) and thorn subject to vacuum stripping at 130° to 250° C. A starting novolak resin is obtained in this way.

The thus obtained novolak resin should have Mw of 1,000 to 10,000. The use of novolak resin with Mw of more than 10,000 leads to a lowering of resolution and sensitivity whereas Mw of less than 1,000 results in poor heat resistance.

According to the present invention, the novolak resin is modified by replacing the hydrogen atom of a hydroxyl group therein by a 1,2-naphthoquinonediazidosulfonyl group whereupon the modified novolak resin can serve as an alkali-soluble resin and photosensitive agent.

For the introduction of a 1,2-naphthoquinonediazidosulfonyl group, 1,2-quinonediazide compounds such as 1,2-naphthoquinonediazido-4-sulfonic acid esters and 1,2-naphthoquinonediazido-5-sulfonic acid esters are used. At this point, a 1,2-naphthoquinonediazidosulfonyl group is introduced in a proportion of 0.03 to 0.27 mol per hydrogen atom of a hydroxyl group in the novolak resin. On this basis, more than 0.27 mol % of substitution results in a novolak resin which is less soluble in ECA and similar solvents and difficult to formulate a resin composition. Less than 0.03 mol % of substitution results in a novolak resin which is low in film retentivity so that the resulting resist composition cannot be patterned and is thus useless. For partial esterification with the above-mentioned 1,2-quinonediazide compounds, a conventional partial esterification technique may be used.

In the practice of the invention, the novolak resin having a 1,2-naphthoquinonediazidosulfonyl group introduced in this way is used as the film forming resin/photosensitive agent. The resist composition of the invention may further contain various additives such as dyes, pigments and surface active agents. Other photosensitive agents may be blended if desired.

Examples of the surface active agent include fluorine type surface active agents such as Florard FC-430 and FC-431 (trade name, Sumitomo 3M K.K.). It is blended in an amount of up to 2 parts by weight per 100 parts by weight of the novolak resin having a 1,2-naphthoquinonediazidosulfonyl group introduced therein.

In one embodiment, the composition of the invention is prepared by dissolving the novolak resin having a 1,2-naphthoquinonediazidosulfonyl group introduced therein in a solvent in a concentration of 15 to 60% by weight and optionally blending additives as mentioned above. The solvent used herein includes ethyl cellosolve acetate (ECA), ethylene glycol monomethyl ether, ethylene glycol monoethyl ether, methyl cellosolve acetate, diethylene glycol monomethyl ether, diethylene glycol monoethyl ether, propylene glycol methyl ether acetate, propylene glycol propyl ether acetate, ethyl lactate, methyl ethyl ketone, cyclohexanone, ethyl 2-dihydroxypropionate, and ethyl 2-hydroxy-2-methylpropionate, with ECA being best suited.

The resist composition of the invention may be prepared in a conventional manner, for example, by dissolving the necessary components in a solvent to a sufficient concentration to form a film of desired thickness by spin coating and passing the solution through a filter having a pore size of 0.2 to 0.5 $\mu$m. The composition is then used by spin coating the composition on a silicon wafer which has been treated with hexamethyldisilazane by means of an automatic coater, pre-baking the coating, exposing the photoresist-coated wafer to light through a mask pattern, and developing the photoresist with an aqueous solution of tetramethylammonium hydroxide, followed by water washing and drying.

EXAMPLE

Examples of the present invention are given below by way of illustration and not by way of limitation. All parts and percents are by weight unless otherwise stated. Mw is a weight average molecular weight calculated as polystyrene.

SYNTHESIS EXAMPLES 1-12

Synthesis of novolak resins

A three-necked flask equipped with a stirrer, condenser and thermometer was charged with 64.9 grams (0.60 mol) of p-cresol, 43.4 grams (0.40 mol) of m-cresol, 48.7 grams (0.60 mol) of an aqueous solution of 37% formaldehyde, and 0.30 grams ($2.40 \times 10^{-3}$ mol) of oxalic acid dihydrate as a polycondensation catalyst. In an oil bath, the flask was heated to an interior temperature of 100° C. for polycondensation to take place for one hour. At the end of reaction, 500 ml of methyl isobutyl ketone (MIBK) was added to the reaction solution, which was agitated for 30 minutes. With the aqueous layer separated off, the product extracted in the MIBK layer was washed five time with 300 ml of pure water and separated therefrom. Vacuum stripping at 150° C. and 4 mmHg by means of an evaporator yielded 87 grams of a novolak resin A.

Novolak resins B to J were synthesized by the same procedure. For comparison purposes, novolak resins K and L were synthesized.

Table 1 shows the ratios of m-cresol/p-cresol and formalin/cresol (F/C) used in the synthesis of novolak resins A to L as well as Mw of the resins.

Mw was measured using a GPC column manufactured by Toso K.K. (two G-2000H$_6$ columns, one G-3000H$_6$ column, and one G-4000H$_6$ column). Measuring conditions included a flow rate of 1.5 ml/min., THF elution solvent, and a column temperature of 40° C.

TABLE 1

| Run No. | Designation | m-cresol/ p-cresol | F/C | Mw |
|---|---|---|---|---|
| 1 | A | 40/60 | 0.50 | 1200 |
| 2 | B | 40/60 | 0.55 | 2500 |
| 3 | C | 50/50 | 0.58 | 3000 |
| 4 | D | 50/50 | 0.62 | 4500 |
| 5 | E | 60/40 | 0.65 | 4000 |
| 6 | F | 60/40 | 0.68 | 5000 |
| 7 | G | 70/30 | 0.72 | 5500 |
| 8 | H | 70/30 | 0.73 | 7500 |
| 9 | I | 80/20 | 0.78 | 8500 |
| 10 | J | 80/20 | 0.82 | 9500 |
| 11 | K | 50/50 | 0.75 | 15000 |
| 12 | L | 50/50 | 0.48 | 800 |

SYNTHESIS EXAMPLES 13-26

Introduction of 1,2-naphthoquinonediazidosulfonyl in novolak resins

In a light-shielded environment, a three-necked flask equipped with a stirrer, condenser and thermometer was charged with 125 grams (1 mol) of novolak resin A (OH equivalent 125), 67 grams (0.25 mol) of 1,2-naphthoquinonediazido-5-sulfonic acid chloride, 300 grams of 1,4-dioxane, and 100 grams of methanol. These components were agitated for one hour to form a solution. With the flask immersed in a water bath maintained at 25° C., 26.5 grams (0.263 mol) of triethylamine was added dropwise so that the interior temperature might be maintained below 30° C. After ripening for one hour, the solution was poured into 1500 cc of 0.1N hydrochloric acid. With the supernatant decanted off, the precipitate was extracted with 800 grams of ethyl acetate, washed with water, separated therefrom, and vacuum stripped at 40° C., obtaining 191 grams of 1,2-naphthoquinonediazidosulfonyl-bearing novolak resin A' as shown in Table 2.

By following the same procedure as above, 1,2-naphthoquinonediazidosulfonyl-bearing novolak resins B' to J' were obtained from novolak resins B to J, respectively. Also for comparison purposes, 1,2-naphthoquinonediazidosulfonyl-bearing novolak resins K' to N' were obtained from novolak resins K, L, C and D.

TABLE 2

1,2-naphthoquinonediazidosulfonyl-bearing novolak resins

| No. | Product | Starting novolak | 1,2-naphthoquinone-diazidosulfonyl Reactant* | Amount** |
|---|---|---|---|---|
| 13 | A' | A | (5) | 0.25 |
| 14 | B' | B | (5) | 0.22 |
| 15 | C' | C | (5) | 0.18 |
| 16 | D' | D | (5) | 0.18 |
| 17 | E' | E | (5) | 0.15 |
| 18 | F' | F | (5) | 0.15 |
| 19 | G' | G | (4) | 0.11 |
| 20 | H' | H | (4) | 0.11 |
| 21 | I' | I | (4) | 0.05 |
| 22 | J' | J | (4) | 0.05 |
| 23 | K' | K | (5) | 0.20 |
| 24 | L' | L | (5) | 0.20 |
| 25 | M' | C | (5) | 0.02 |
| 26 | N' | D | (5) | 0.30 |

*(5): 1,2-naphthoquinonediazido-5-sulfonyl
(4): 1,2-naphthoquinonediazido-4-sulfonyl
**amount (mol %) of 1,2-naphthoquinonediazidosulfonyl based on the moles of phenolic OH

EXAMPLES 1-10 & COMPARATIVE EXAMPLES 1-4

A composition in solution form within the scope of the invention was prepared by dissolving 25 grams of product A' in 75 grams of ECA and passing the solution through a membrane filter with a pore diameter of 0.2 μm. This is designated solution A".

The solution was coated on a 6-inch bare silicon wafer by means of a spin coater at 4000 rpm and softly baked on a hot plate at 90° C. for 90 seconds to form a resist film of 0.8 μm thick. The resist film was exposed to i-rays, developed and rinsed.

The resist film was evaluated for optimum exposure Eop. This resist evaluation include exposure by a stepper NSR-1755i7A manufactured by Nikon K.K. (an i-ray stepper with NA=0.50) and pattern observation under a scanning electron microscope manufactured by Hitachi K.K. When exposure is made in a pattern of 5 μm L/S at the optimum focus position, Eop is defined as the exposure amount providing a size ratio of 1:1 at the bottom of line and space.

The resist film was also examined for heat resistance. Heat resistance was judged by observing whether or not a pattern of 5 μm L/S was maintained after heating the resist film on a hot plate at 130° C. for 5 minutes.

Like Example 1, composition solutions B" to J" were prepared and evaluated for Eop and heat resistance. For comparison purposes, composition solutions K" to N" were prepared and evaluated for Eop and heat resistance.

Heat resistance was labeled "◯" when good and "X" when poor.

COMPARATIVE EXAMPLE 5

A two component system resist solution was prepared by dissolving 20 grams of novolak resin A and 6 grams of a photosensitive agent shown below in 70 grams of ECA. It was also evaluated for Eop and heat resistance.

Photosensitive agent:

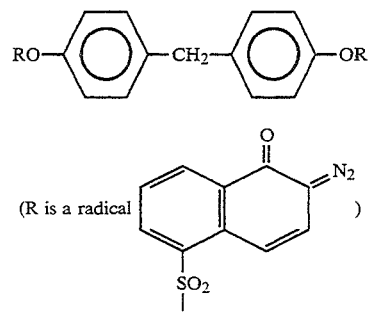

(R is a radical )

The results are shown in Table 3.

TABLE 3

| Composition solution | Solids | | | Film thickness (μm) | Eop (mJ/cm²) | Heat Resistance |
|---|---|---|---|---|---|---|
| | Resin | Content (wt %) | Solvent | | | |
| Example | | | | | | |
| 1 | A" | A' | 25 | ECA | 0.8 | 80 | ◯ |
| 2 | B" | B' | 25 | " | 0.8 | 115 | ◯ |
| 3 | C" | C' | 28 | " | 1 | 125 | ◯ |
| 4 | D" | D' | 28 | " | 1 | 185 | ◯ |
| 5 | E" | E' | 35 | " | 3 | 300 | ◯ |

TABLE 3-continued

| Composition solution | Resin | Solids Content (wt %) | Solvent | Film thickness (μm) | Eop (mJ/cm$^2$) | Heat Resistance |
|---|---|---|---|---|---|---|
| 6 | F" | F' | 35 | " | 3 | 415 | ○ |
| 7 | G" | G' | 47 | " | 10 | 800 | ○ |
| 8 | H" | H' | 47 | " | 10 | 1200 | ○ |
| 9 | I" | I' | 52 | " | 15 | 1500 | ○ |
| 10 | J" | J' | 52 | " | 15 | 2000 | ○ |
| Comparative Example |||||||
| 1 | K" | K' | 28 | " | 1 | 3000 | — |
| 2 | L" | L' | 28 | " | 1 | 28 | X |
| 3 | M" | M' | 28 | " | 1 | 50 | X |
| 4 | N" | N' | 28 | " | UM | UM | UM |
| 5 | — | A | 27 | " | 1 | 150 | X |

*UM: unmeasurable because resin N' could not be dissolved in the solvent.

There has been described a resist composition comprising a 1,2-naphthoquinonediazidosulfonyl-bearing novolak resin which serves as a resin and a photosensitive agent. The composition is uniform in that the photosensitive agent is uniformly distributed add incorporated in the novolak resin, and thus forms a uniform resist film. It is a useful positive resist having the advantages of sensitivity, resolution, heat resistance, and film retentivity.

Although some preferred embodiments have been described, many modifications and variations may be made thereto in the light of the above teachings. It is therefore to be understood that within the scope of the appended claims, the invention may be practiced otherwise than as specifically described.

We claim:

1. A resist composition comprising:
 a novolak resin having at least one recurring unit of the formula (1):

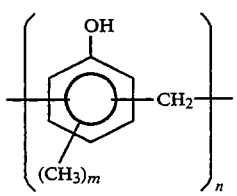

(1)

wherein n is an integer of 1 to 4 and m is an integer of 0 to 3, and having a weight average molecular weight of 2,500 to 10,000 calculated as polystyrene,
 wherein the hydrogen atoms of hydroxyl groups in said novolak resin are replaced by a 1,2-naphthoquinonediazidosulfonyl group in a proportion of 0.03 to 0.27 mol per hydrogen atom,
 wherein said novolak resin functions as an alkali-soluble resin and a photosensitive agent; and
 a solvent.

2. A photosensitive novolak resin having at least one recurring unit of the formula (1):

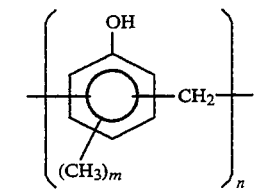

(1)

wherein n is an integer of 1 to 4 and m is an integer of 0 to 3, said resin having a weight average molecular weight of 2,500 to 10,000 calculated as polystyrene,
 wherein the hydrogen atoms of hydroxyl groups in said novolak resin are replaced by a 1,2-naphthoquinonediazidosulfonyl group in a proportion of 0.03 to 0.27 mol per hydrogen atom.

3. A resist composition according to claim 2, further comprising at least one dye pigment surface-active agent and/or another photosensitive agent.

4. A photsensitive novolak resin according to claim 1, wherein said resin has a weight average molecular weight of 2,500–9,500 calculated as polystyrene.

5. A photsensitive novolak resin according to claim 1, wherein said resin is prepared by:
 polycondensing a phenol selected from m-cresol, p-cresol, phenol, a xylenol, a trimethylphenol, or mixtures thereof and an aldehyde selected from aldehydes having up to 4 C atoms,
 wherein the amount of aldehyde used is 0.3–1.5 mol per mol of phenyl in the phenol and polycondensation occurs in the presence of a hydrophilic solvent and in the presence of a catalyst selected from oxalic acid, acetic acid, formic acid, hydrochloric acid, nitric acid or sulfuric acid,
 the polycondensation reaction is conducted at a temperature of 50°–150° C.; and
 the resultant novolak resin is modified by partial esterification with 1,2-quinonediazide compounds selected from 1,2-naphthoquinonediazido-4-sulfonic acid esters and 1,2-naphthoquinonediazido-5-sulfonic acid esters, wherein said partial esterification results in the replacement of hydrogen atoms of hydroxy groups of the novolak resin with 1,2-naphthoquinonediazidosulfonyl groups in a proportion of 0.03–0.27 mol per hydrogen atom of hydroxyl group in the novolak resin.

6. In a method of applying a positive photoresist on a wafer to form a resist film thereon, the improvement wherein the resist contains as a major component a novolak resin according to claim 1, wherein said novolak resin functions as an alkali-soluble resin and as a photosensitive agent.

7. A photosensitive novolak resin according to claim 1, wherein the proportion of hydrogen atoms of hydroxy groups of said novolak resin replaced by 1,2-naphthoquinonediazidosulfonyl groups is 0.05–0.25 mol per hydrogen atom.

8. A resist composition according to claim 2, wherein said novolak resin is dissolved in said solvent in a concentration of 15–60% by weight.

9. A resist composition according to claim 2, wherein said solvent is ethyl cellosolve acetate, ethylene glycol monomethyl ether, ethylene glycol monoethyl ether, methyl cellosolve acetate, diethylene glycol monomethyl ether, diethylene glycol monoethyl ether, propylene glycol methyl ether acetate, propylene glycol propyl ether acetate, ethyl lactate, methyl ethyl ketone, cyclohexanone, ethyl 2-dihydroxypropionate or ethyl 2-hydroxy-2-methylpropionate.

* * * * *